United States Patent
Maurice et al.

[11] Patent Number: 5,408,092
[45] Date of Patent: Apr. 18, 1995

[54] MULTIPLE OPTIC SENSOR SYSTEM

[75] Inventors: Lisa B. Maurice, Jericho; Frederick L. Lichtenfels, II, Vergennes; Bruce R. Kline, Starksboro, all of Vt.

[73] Assignee: Simmonds Precision Products, Inc., Akron, Ohio

[21] Appl. No.: 164,190

[22] Filed: Dec. 9, 1993

[51] Int. Cl.⁶ ................................................ H01J 5/16
[52] U.S. Cl. ........................... 250/227.21; 250/227.17
[58] Field of Search ..................... 250/227.14, 227.17, 250/227.21, 225; 385/12, 13

[56] References Cited

U.S. PATENT DOCUMENTS

| | | | |
|---|---|---|---|
| 3,621,390 | 11/1971 | Willisen | 324/96 |
| 3,679,974 | 7/1972 | Mollenbeck | 324/96 |
| 3,952,265 | 4/1976 | Hunsperger | 331/94.5 H |
| 4,281,253 | 7/1981 | Culver | 250/551 |
| 4,317,232 | 2/1982 | Pickett et al. | 455/606 |
| 4,356,448 | 10/1982 | Brogardh et al. | 324/244 |
| 4,516,073 | 5/1985 | Doriath et al. | 324/244 |
| 4,529,875 | 7/1985 | Brogardh et al. | 250/227 |
| 4,564,756 | 1/1986 | Johnson | 250/231 SE |
| 4,578,639 | 3/1986 | Miller | 324/96 |
| 4,608,535 | 8/1986 | Tada et al. | 324/244 |
| 4,773,074 | 9/1988 | Hunsperger et al. | 372/50 |
| 4,799,797 | 1/1989 | Huggins | 385/12 |
| 4,891,579 | 1/1990 | Aoshima et al. | 324/96 |
| 4,897,542 | 1/1990 | Dakin et al. | 250/227.21 |
| 4,916,387 | 4/1990 | Miller | 324/96 |
| 4,948,960 | 8/1990 | Simms et al. | 250/227.11 |
| 4,989,051 | 1/1991 | Whitehead et al. | 357/19 |
| 5,051,577 | 9/1991 | Lutz et al. | 250/227.17 |
| 5,149,692 | 9/1992 | Maurice | 250/227.17 |
| 5,290,103 | 3/1994 | Fevrier et al. | 385/12 |

Primary Examiner—David C. Nelms
Assistant Examiner—John R. Lee
Attorney, Agent, or Firm—Leonard L. Lewis; William E. Zitelli

[57] ABSTRACT

An optic sensor system comprising N optic sensors, each of the N sensors operating with received input light and providing output light having a characteristic corresponding to a sensed parameter; a number, less than N+2, of devices wherein each of the devices operates as a light source and as a light detector such that one device can be used to transmit interrogation light to two of the sensors, with two other of the devices being used to receive output light from the interrogated sensors; and optic waveguide means for transmitting light between the sensors and the devices.

26 Claims, 2 Drawing Sheets

MULTIPLE OPTIC SENSOR SYSTEM

BACKGROUND OF THE INVENTION

The invention relates generally to techniques for interrogating optic sensors of the type that modulate electromagnetic energy in relation to a number of measured or sensed parameters such as rotational speed, proximity of a target, position encoding and so on. More particularly, the invention relates to system architectures that involve the use of a plurality of such sensors.

Many types of optic sensors have been developed and the extent of their commercial use is only recently beginning to be realized. A typical optic sensor uses a source of light that is transmitted to the sensor and a light detector for transducing the modulated light into an electrical signal for further processing. Transmission of the light is commonly done with optic fibers and associated optic couplings and connectors.

For example, recently an improved sensor design has been disclosed in U.S. Pat. No. 5,149,962, issued to Maurice, which patent is owned in common by the assignee of the instant application. This sensor is a magneto-optic type sensor that uses a bi-directional sensing technique so that the optic signals are self-referenced and provide an inherent built-in-test capability. The improved sensor also features the use of photoelectric devices, such as LEDs, that individually perform a dual function as light source and detector for interrogating the sensor bi-directionally. The use of dual-function devices significantly reduces the sensor envelope and simplifies the sensor design and reduces overall cost.

Because an optic sensor requires at least one light source and light detector for operation, systems that use a plurality of optic sensors can easily involve the use of a large number of photoelectric devices so that all the sensors can be interrogated. Although optic switches could be used to reduce the number of photo-sensors, such devices are expensive and would require complicated timing and control logic. The objective exists, therefore, for a system architecture or network that can use a plurality of optic sensors with a reduced number of light sources and detectors to reduce system complexity and cost.

SUMMARY OF THE INVENTION

To the accomplishment of the foregoing objectives, the invention, in one embodiment, contemplates an optic sensor system comprising N optic sensors, each of said N sensors operating with received input light and providing output light having a characteristic corresponding to a sensed parameter; a number, less than N+2, of devices wherein each of said devices operates as a light source and as a light detector such that one device can be used to transmit interrogation light to two of said sensors, with two other of said devices being used to receive output light from said interrogated sensors; and optic waveguide means for transmitting light between said sensors and said devices.

The invention also contemplates a network for interrogating a number (N) of optic sensors comprising a plurality of light source/detector means for transmitting light to said sensors and detecting light received from said sensors, optic waveguide means for connecting said plurality of source/detector means to said N sensors in a daisychain configuration, and circuit means for multiplexed operation of said plurality of source/detector means.

The invention also contemplates the methods of operation of the system and network described herein, as well as a method for interrogating N optic sensors using a limited number of photoelectric devices wherein each of said devices can function as a source and a detector comprising the steps of:

a) activating a first device as a single source to interrogate at least a first of the sensors during a first period of time;

b) using at least another of said devices to detect an output from said first sensor during said first period of time;

c) deactivating said first device and activating a second of said devices as a single source to interrogate at least two of the sensors during a second period of time;

d) using at least two of said devices to detect respective outputs from said sensors during said second period of time; and e) repeating steps a) through d) as required until all the sensors have been interrogated.

These and other aspects and advantages of the present invention will be appreciated by those skilled in the art from the following detailed description of the preferred embodiments with the best mode contemplated for practicing the invention in view of the accompanying drawings.

DETAILED DESCRIPTION OF THE INVENTION

Figure 1:
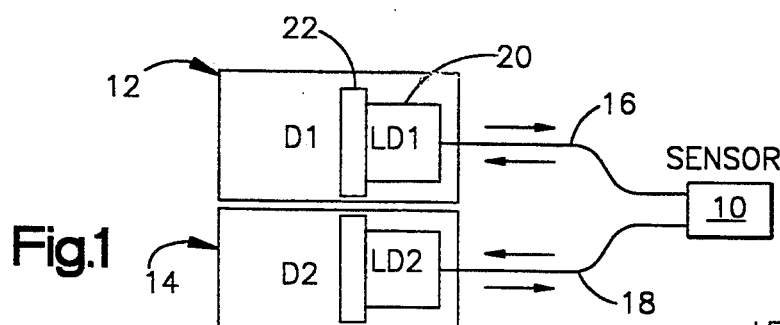
FIG. 1 is a simplified schematic of a single sensor arrangement that utilizes bi-directional sensing with two photoelectric devices.

With reference to FIG. 1, a single optic sensor arrangement is schematically shown that includes the sensor 10, a pair of photoelectric devices 12,14 and a pair of optic fibers 16,18 that transmit light respectively between the photoelectric devices and the sensor 10. An important aspect of the arrangement in FIG. 1 is that the photoelectric devices can each serve as both a source of input light for the sensor as well as a light detector for light returned from the sensor. A control circuit (not shown in FIG. 1) is used to switch the photoelectric devices on and off thus determining the periods of time that each operates as a source or detector.

In particular, the devices 12,14 are operated so as to implement a bi-directional transmission of light to and from the sensor 10, as represented by the arrows in FIG. 1. This bi-directional interrogation of the optic sensor is the subject of U.S. Pat. No. 5,149,962 (the '962 patent), commonly owned by the assignee of the present invention, the entire disclosure of which is fully incorporated herein by reference.

The particular type of sensor 10 described in the '962 patent is a magneto-optic sensor that utilizes the Faraday effect, for example, to detect debris in a fluid or detect target position as with a proximity sensor. In the embodiment of FIG. 1, each photoelectric device is shown as being a hybrid device including a source 20 and a detector 22 contained in a common optic package. For example, the source may be a laser diode and the detector a back faceted diode. However, as is also taught in the '962 patent, the photoelectric devices 12,14 can be light emitting diodes (LEDs) that exhibit similar spectral responses. An example of a suitable LED device is part no. 1A208 available from ABB HAFO, although any number of other conventional devices can be used. In either embodiment, as well as others, an important aspect is that a single package device can operate as both a light source and detector and use the same optic fiber or optic fiber bundle to send and receive light. Thus, the photoelectric device 12 can launch light into its respective fiber 16 and receive light from the sensor through the same optic fiber for detection.

This use of a number of photoelectric devices with each device functioning as both source and detector helps reduce the envelope of the sensor arrangement and also provides a convenient implementation of the bi-directional sensing scheme. The referenced patent also discloses various alternative arrangements for carrying out the bi-directional sensing scheme.

The instant invention builds on the teachings of the '962 patent in order to realize a multiple sensor network. However, certain differences should be noted from the outset. First, the instant invention is not limited to any particular type of optic sensor. The Faraday-type sensor in the referenced patent is but one example of any number of optic sensors that may be useful with this invention. Second, while the present invention is described with respect to a preferred use of LEDs for the photoelectric devices, this is for purposes of explanation only and should not be construed in a limiting sense. Any optic arrangement or device, single, hybrid, or otherwise, including optic fiber arrangements, that can be used to source and detect light at a common point are feasible with the present invention. Third, while the instant invention is particularly useful for implementing a bi-directional sensing scheme with a plurality of sensors, advantages of the invention can be realized without the use of bi-directional interrogation of the sensors.

Figure 2:
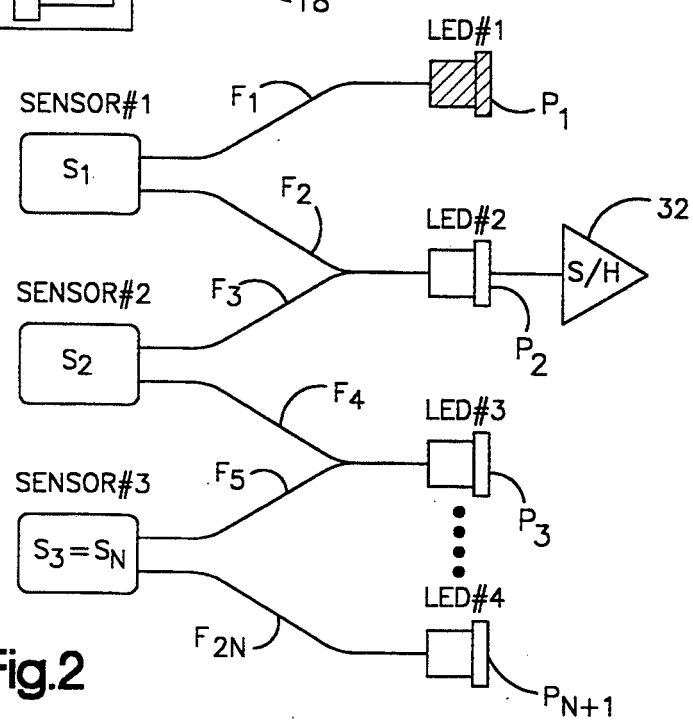
FIGS. 2 and 3 are schematic representations of a multiple sensor network employing N+1 devices to interrogate N sensors, each of the Figures showing data collection from the sensors at different time periods.
Figure 3:
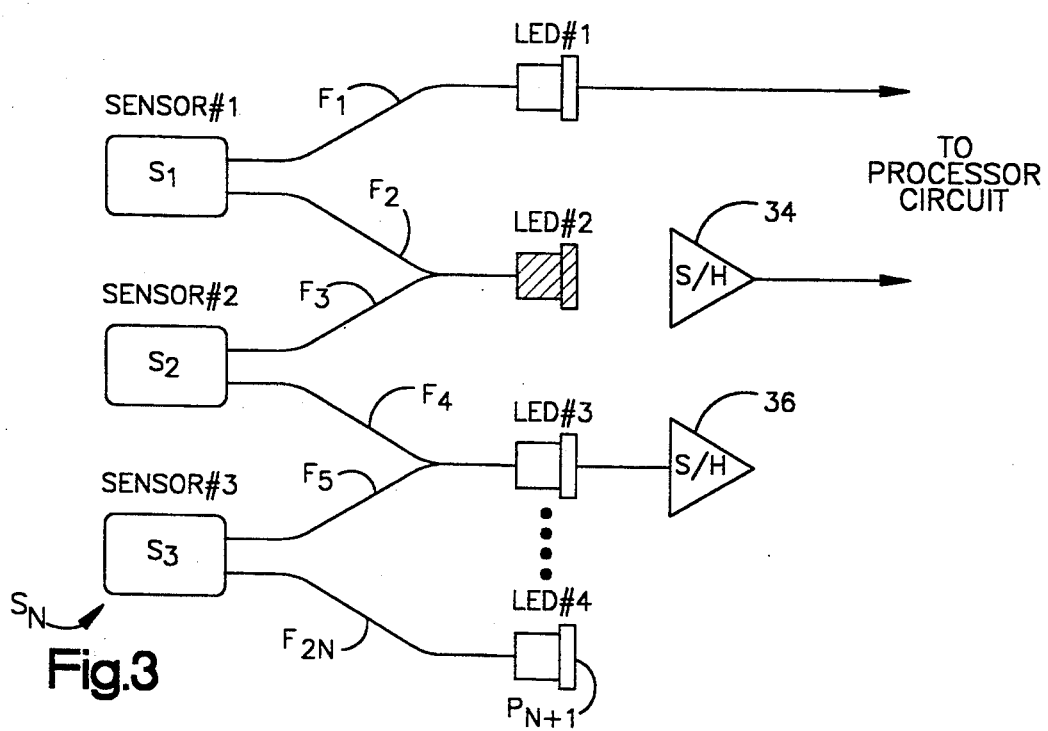

With reference next to FIGS. 2 and 3, a first embodiment of the present invention is shown in simplified schematic form for ease of explanation and clarity. A multiple sensor system or network 30 is provided that includes N optic sensors ($S_1$–$S_N$). In the example used herein, three sensors $S_1$, $S_2$ and $S_3$ are shown (N=3).

A plurality of light source/detector elements $P_1$, $P_2$, and $P_3$ up to $P_{N+1}$ are arranged in a daisy-chain configuration using a plurality of optic fibers $F_1$ through $F_{2N}$. The elements $P_1$–$P_{N+1}$ can be optically coupled to their respective optic fibers in a conventional manner. Preferably, each source/detector element is an LED that can transmit and detect light using similar spectral response characteristics. In FIG. 2, $P_1$ is shaded to represent a point in time or first period during which that device is active or emitting light. The light is launched into fiber $F_1$ to the first sensor $S_1$. The sensor $S_1$ modulates or otherwise changes one or more characteristics of the light and launches output light into the second fiber $F_2$. This light is transmitted to and detected by the second device $P_2$. The output of the detector $P_2$ can be stored using a sample and hold circuit 32 if desired for further processing.

At this time it should be noted that in the examples being described herein, reference to sensors and devices as being "first", "second" and so on as well as "first period" and "second period" of time is arbitrary and only for purposes of explanation. Anyone skilled in the art will readily appreciate that the sensors can be interrogated in any desired sequence.

In FIG. 3, the first device P is off and the second device $P_2$ is on during a second time period. The light from $P_2$ is launched into two fibers, namely $F_2$ and $F_3$. Therefore, the first and second sensors $S_1$ and $S_2$ are interrogated. Devices $P_1$ and $P_3$ function as detectors during this second time period. Again, sample and hold circuits 34,36 can be used for temporarily holding the detector output signals for further processing. For example, during the second time period (FIG. 3) the data from the first two sensors can be sent on for further processing while the data from the third detector $P_3$ is temporarily held. Note that in comparing FIGS. 2 and 3 that the sensor $S_1$ received light in one direction from LED $P_1$, and received light in an opposite direction from LED $P_2$. This arrangement is useful for implementing a bi-directional sensing scheme because bi-directional data samples for each sensor are ratio processed as is more fully described in the referenced patent.

This multiplexed sequence of operating the devices $P_1$ through $P_N$ is continued until all the sensors have been interrogated. It will be appreciated that the network of FIG. 2 permits N sensors to be interrogated using only N+1 devices (rather than 2N as would be otherwise expected); and utilizes 2N optic fibers (or 2N fiber bundles depending on the application). It will further be noted that regardless of the number of sensors used in a network, for each pair of sensors (e.g. $S_1$ and $S_2$) that share three devices $P_1$14 $P_3$, only one of the devices is transmitting light at a given time.

Figure 4:
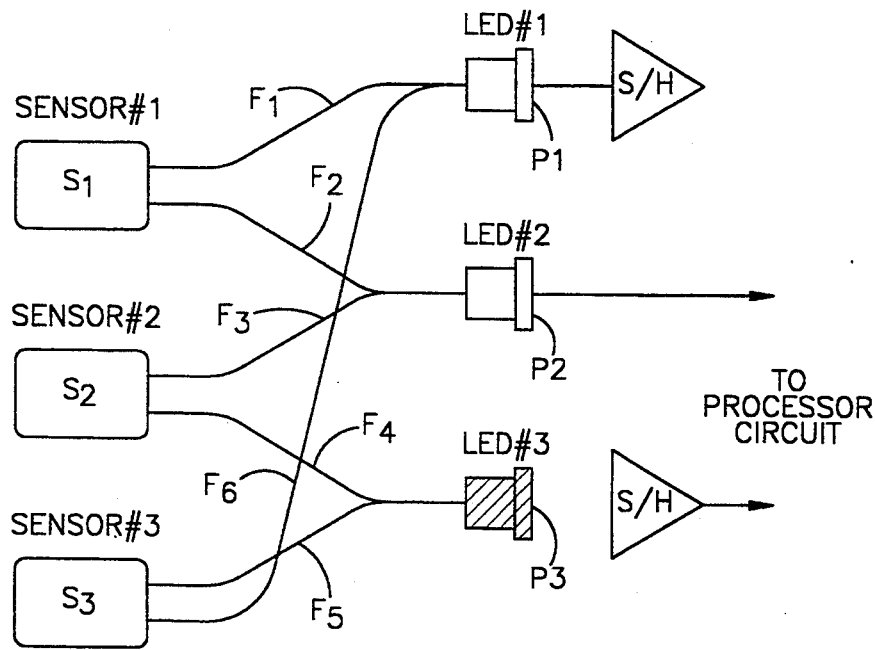
FIG. 4 is a simplified schematic of a multiple sensor network employing N devices to interrogate N sensors.

Referring next to FIG. 4, there is illustrated another preferred embodiment of the invention (in this example, only N=3 sensors are shown, it being understood that three or more sensors can be used). This network architecture is similar to that shown in FIGS. 2 and 3 and operates in much the same way, except that in this embodiment, the output fiber $F_6$ ($F_{2N}$) of the last sensor $S_3$ ($S_N$) is optically coupled back to the first device $P_1$. This results in the use of only N devices to interrogate N sensors. In the example of FIG. 4, the third device $P_3$ is serving as a light source so that sensors $S_2$ and $S_3$ are being interrogated. The sensor $S_3$ and $S_2$ outputs are detected respectively by devices $P_1$ and $P_2$. The output from $P_1$ is shown being sampled and held while the output from $P_2$ is sent to the processor along with the sample from $P_3$ stored from the preceding time that $S_3$ was interrogated. Again, the sample and hold processing is a convenience when implementing a bi-directional sensing scheme, or other designs where the sensor data must be temporarily stored until the processor is ready to receive it.

A particular advantage of the arrangement of FIG. 4 is that it includes an inherent self-test capability. This arises from the use of two LEDs to interrogate each sensor. For example, suppose while device $P_1$ is on (i.e. functioning as a light source) device $P_2$ detects an output from sensor $S_1$, but device $P_3$ fails to detect an output from sensor $S_3$. If, on the other hand, device $P_3$ detects an output from sensor $S_2$ when device $P_2$ is on, then a failure in optic fibers $F_5,F_6$ or sensor $S_3$ is indicated. As another example, suppose device $P_3$ detects an output when $P_1$ is on but not when $P_2$ is on. If $P_1$ and $P_3$ fail to detect an output when $P_2$ is supposed to be on, then a failure of $P_2$ or its associated fibers is indicated. If in this scenario $P_1$ does receive an output when $P_2$ is on (but $P_3$ does not), then a failure in fibers $F_3$ or $F_4$ is indicated. Other self-test functions can be similarly implemented depending on the particular application.

Figure 5:
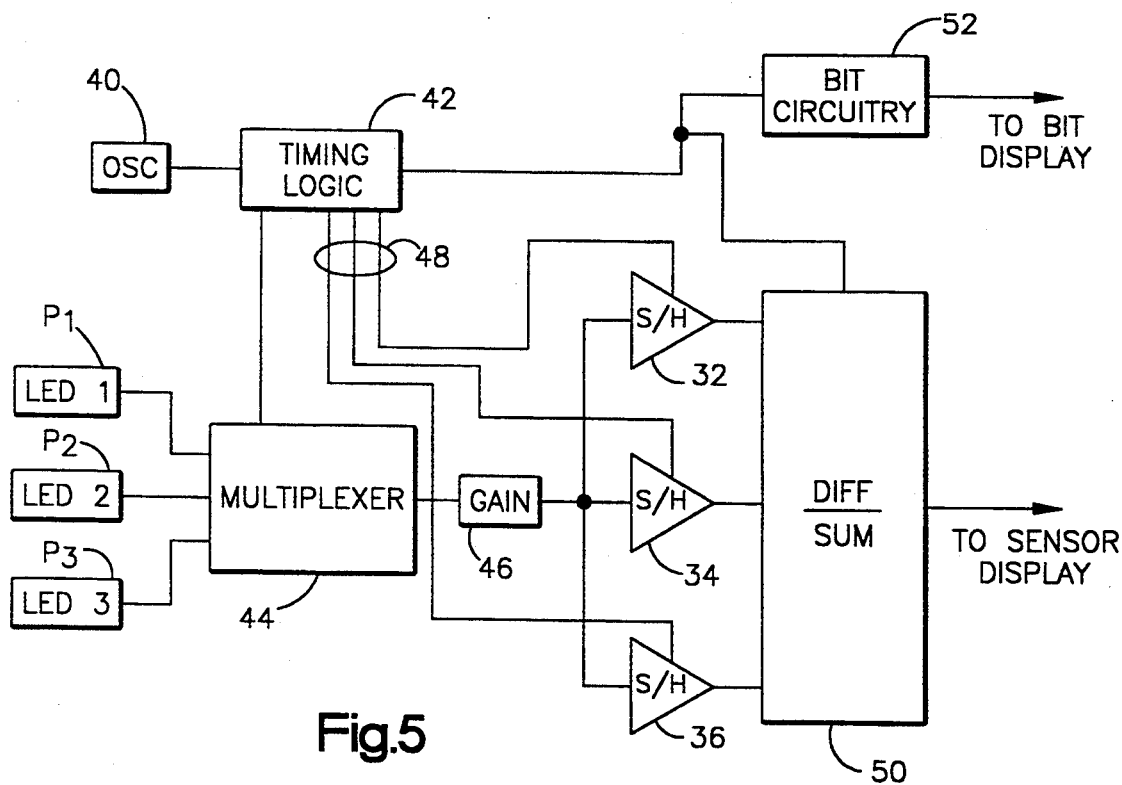
FIG. 5 is an electrical schematic block diagram of an exemplary control circuit and signal processing circuit that can be used with the invention.

An exemplary control and signal processing circuit is shown schematically in FIG. 5. This circuit is particularly useful for implementing bi-directional sensing, however, it is only intended to be exemplary. Anyone skilled in the art will readily appreciate that many different types of control and processing circuits can be used to realize the present invention. For example, various functions of the circuit can be implemented with discrete devices, a microprocessor based system or other programmable circuit. More or less functions can also be implemented, but an important function is the sequential operation of the devices $P_1$ through $P_N$.

The control circuit may include an oscillator or other main timing element 40 that drives a logic circuit 42. The logic circuit 42 controls a multiplexer 44 which functions basically as a multiple switching device responsive to the logic circuit 42. The multiplexer 44 determines which LED or device $P_N$ is active as a source, and which ones are being used as detectors during periods of time controlled by the logic circuit 42. As is well known to those skilled in the art, an LED functions as a light source when it is forward biased. An LED can also operate as a light detector when under reverse bias or no bias in response to light within its emitted spectral band. Under timing control and device selection from the logic circuit 42, the multiplexer 44 connects or switches the appropriate device $P_1-P_N$ output to a gain circuit 46 (with or without a reverse bias applied to the LED as determined for a particular application and the LED device characteristics) at the appropriate times that each device is acting as a detector. The multiplexer also connects each LED to an appropriate drive voltage when each device is acting as a light source. The gain circuit 46 output is connected to a series of sample and hold circuits 32, 34 and 36 as previously described herein, which are also controlled by the logic circuit 42 through connections 48. The multiplexer outputs can be further processed in the digital or analog domain as desired. A suitable device for the multiplexer is part no. MUX 24 available from Analog Devices. The switching function for forward and reverse bias of each device $P_N$ can be carried out, for example, with a drive transistor that turns on and off in response to the timing logic 42 signals.

Further signal processing circuitry can be provided, for example, in the form of a difference-over-sum ratio circuit 50 and a built-in-test circuit 52, which circuits function in a manner as described in the '962 patent. Again, the particular type of signal processing used will depend on the particular end-uses of the invention employed by a designer, but a timing/multiplex circuit will generally be used in order to control the desired sequence of interrogating the plurality of sensors.

While the invention has been shown and described with respect to specific embodiments and aspects thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. An optic sensor system comprising N optic sensors, each of said N sensors operating with received input light and providing output light having a characteristic corresponding to a sensed parameter; a number, less than N+2, of devices wherein each of said devices operates as a light source and as a light detector such that one device can be used to transmit interrogation light to two of said sensors, with two other of said devices being used to receive output light from said interrogated sensors; and optic waveguide means for transmitting light between said sensors and said devices.

2. The system of claim 1 wherein at least one of said devices is a light emitting diode.

3. The system of claim 1 wherein at least one of said devices is a hybrid device having a light source/detector pair sharing a common waveguide connection.

4. The system of claim 3 wherein said hybrid device comprises a laser diode and back faceted diode.

5. The system of claim 1 further comprising a control circuit for multiplexed operation of said devices whereby one device at a time functions as a light source and at least one other of said devices functions as a light detector.

6. The system of claim 5 wherein, for at least one of said devices when functioning as a light source, there are at least two other of said devices functioning as light detectors.

7. The system of claim 5 wherein said control circuit comprises a multiplexer that sequentially selects each of said devices to function as a light source.

8. The system of claim 5 wherein said control circuit comprises logic means for using said devices for bi-directional interrogation of said sensors.

9. The system of claim 7 wherein said control circuit further comprises sample and hold means for receiving and storing device output signals from the multiplexer when each said device operates as a detector, said multiplexer switching each device between operating modes as a light source and light detector.

10. The system of claim 9 wherein (N+1) of said devices can interrogate said N sensors.

11. The system of claim 9 wherein N devices can interrogate said N sensors.

12. The system of claim 11 wherein said optic waveguide means comprises a plurality of optic fibers such that each fiber optically couples one of said devices to one of said sensors.

13. The system of claim 12 wherein each of said devices is optically connected to two of said sensors.

14. A network for interrogating a number (N) of optic sensors comprising a plurality of light source/detector means for transmitting light to said sensors and detecting light received from said sensors, optic waveguide means for connecting said plurality of source/detector means to said N sensors in a daisychain configuration, and circuit means for multiplexed operation of said plurality of source/detector means.

15. The network of claim 14 wherein at most (N+1) of said plurality of source/detector means are needed to interrogate the N sensors.

16. The network of claim 14 wherein at most N of said plurality of source/detector means are needed to interrogate the N sensors.

17. The network of claim 14 where in each of said source/detector means is used as a source to interrogate respectively at least two of the sensors.

18. The network of claim 14 where in one of said source/detector means is activated at a time during which at least two other of said source/detector means function as detectors.

19. The network of claim 14 where in each of said source/detector means comprises a light emitting diode.

20. The network of claim 14 wherein at least one of said source/detector means is a hybrid device having source and detector elements enclosed in a common package.

21. A method for interrogating N optic sensors using a limited number of photoelectric devices wherein each of said devices can function as a source and a detector comprising the steps of:
   a) activating a first device as a single source to interrogate at least a first of the sensors during a first period of time;
   b) using at least another of said devices to detect an output from said first sensor during said first period of time;
   c) deactivating said first device and activating a second of said devices as a single source to interrogate at least two of the sensors during a second period of time;
   d) using at least two of said devices to detect respective outputs from said sensors during said second period of time; and
   e) repeating steps a) through d) as required until all the sensors have been interrogated.

22. The method of claim 21 where in each of the photoelectric devices is used to interrogate at least two of the sensors during its respective source time.

23. The method of claim 22 wherein N devices are used to interrogate N sensors.

24. The method of claim 23 wherein each of said N devices is an LED.

25. The method of claim 23 wherein each of said devices is a hybrid contained in a single package.

26. The method of claim 21 including using two of said devices to bi-directionally interrogate a sensor.

* * * * *